(12) United States Patent
Yuda et al.

(10) Patent No.: US 11,239,323 B2
(45) Date of Patent: Feb. 1, 2022

(54) OXIDE SEMICONDUCTOR DEVICE AND METHOD FOR MANUFACTURING SAME

(71) Applicants: Mitsubishi Electric Corporation, Tokyo (JP); Tokyo Institute of Technology, Tokyo (JP)

(72) Inventors: Yohei Yuda, Tokyo (JP); Tatsuro Watahiki, Tokyo (JP); Shinsuke Miyajima, Tokyo (JP); Yuki Takiguchi, Tokyo (JP)

(73) Assignees: MITSUBISHI ELECTRIC CORPORATION, Tokyo (JP); TOKYO INSTITUTE OF TECHNOLOGY, Tokyo (JP)

( * ) Notice: Subject to any disclaimer, the term of this patent is extended or adjusted under 35 U.S.C. 154(b) by 0 days.

(21) Appl. No.: 17/257,024

(22) PCT Filed: Aug. 8, 2019

(86) PCT No.: PCT/JP2019/031483
§ 371 (c)(1),
(2) Date: Dec. 30, 2020

(87) PCT Pub. No.: WO2020/039971
PCT Pub. Date: Feb. 27, 2020

(65) Prior Publication Data
US 2021/0234009 A1 Jul. 29, 2021

(30) Foreign Application Priority Data
Aug. 22, 2018 (JP) .............................. JP2018-155447

(51) Int. Cl.
*H01L 29/24* (2006.01)
*H01L 21/02* (2006.01)
(Continued)

(52) U.S. Cl.
CPC ........ *H01L 29/24* (2013.01); *H01L 21/02178* (2013.01); *H01L 21/02565* (2013.01);
(Continued)

(58) Field of Classification Search
CPC ....... H01L 29/24; H01L 29/242; H01L 29/78; H01L 29/782; H01L 29/7827;
(Continued)

(56) References Cited

U.S. PATENT DOCUMENTS 10,483,110 B2 * 11/2019 Yuda .................. H01L 21/0495
2011/0215338 A1 9/2011 Zhang
(Continued)

FOREIGN PATENT DOCUMENTS

| JP | 2013-522876 A | 6/2013 |
| JP | 2017-199869 A | 11/2017 |
| WO | 2011/112504 A1 | 9/2011 |

OTHER PUBLICATIONS

International Search Report and Written Opinion dated Nov. 12, 2019, received for PCT Application No. PCT/JP2019/031483, Filed on Aug. 8, 2019, 10 pages including English Translation.

*Primary Examiner* — Monica D Harrison
(74) *Attorney, Agent, or Firm* — Xsensus LLP

(57) ABSTRACT

An object is to provide a technology for enabling prevention of deterioration of characteristics of an oxide semiconductor device. The oxide semiconductor device includes an n-type gallium oxide epitaxial layer, a p-type oxide semiconductor layer, and an oxide layer. The p-type oxide semiconductor layer is disposed above the n-type gallium oxide epitaxial layer, contains an element different from gallium as a main component, and has p-type conductivity. The oxide layer is disposed between the n-type gallium oxide epitaxial layer and the p-type oxide semiconductor layer, and is made of a material different from gallium oxide and different at least
(Continued)

partly from a material of the p-type oxide semiconductor layer.

10 Claims, 4 Drawing Sheets

(51) Int. Cl.
    *H01L 21/443*     (2006.01)
    *H01L 21/465*     (2006.01)
    *H01L 29/66*     (2006.01)
    *H01L 29/78*     (2006.01)
    *H01L 29/872*     (2006.01)

(52) U.S. Cl.
    CPC .......... *H01L 21/443* (2013.01); *H01L 21/465* (2013.01); *H01L 29/242* (2013.01); *H01L 29/66969* (2013.01); *H01L 29/78* (2013.01); *H01L 29/7827* (2013.01); *H01L 29/872* (2013.01)

(58) Field of Classification Search
    CPC . H01L 29/87; H01L 29/872; H01L 21/02565; H01L 21/443; H01L 21/465
    USPC .......................................................... 257/43
    See application file for complete search history.

(56) References Cited

U.S. PATENT DOCUMENTS

| | | | |
|---|---|---|---|
| 2013/0161610 A1* | 6/2013 | Yamazaki | .......... H01L 29/7869 257/43 |
| 2019/0148563 A1 | 5/2019 | Sasaki et al. | |

* cited by examiner

OXIDE SEMICONDUCTOR DEVICE AND METHOD FOR MANUFACTURING SAME

CROSS-REFERENCE TO RELATED APPLICATIONS

The present application is based on PCT filing PCT/JP2019/031483, filed Aug. 8, 2019, which claims priority to JP 2018-155447, filed Aug. 22, 2018, the entire contents of each are incorporated herein by reference.

TECHNICAL FIELD

The present invention relates to an oxide semiconductor device and a method for manufacturing the same.

BACKGROUND ART

Power electronics (abbreviated as PE) is a technology for promptly and efficiently converting electricity such as direct current, alternating current, and frequencies. Power electronics is a combined technology of the conventional power engineering, and electronic engineering and control engineering which are based on recent semiconductors. Today, power electronics is almost always applied wherever electricity is used, for example, for power, industry, transportation, and households.

Recent years have seen an increasing upward trend in a ratio of electric energy to the total energy consumption, i.e., a rate of electrification not only in Japan but also worldwide. As a background to this trend, convenient and energy-saving appliances in terms of electricity usage have been developed in recent years. This increases the utilization ratio of electricity. The PE technology is the base technology for these appliances.

Put it differently, the PE technology is a technology for converting an input into electricity suitable for an appliance to be used, whatever conditions of electricity before conversion are (e.g., the magnitude of a frequency, a current, or a voltage). The base elements in the PE technology are rectifiers and inverters. Furthermore, the rectifiers and the inverters are based on semiconductors and semiconductor elements such as diodes or transistors which are applications of the semiconductors.

In today's PE fields, diodes serving as semiconductor rectifiers are used for various purposes including electrical appliances. The diodes are applied in wide frequency bands.

In recent years, switching elements capable of operating with low losses and at high frequencies in applications that require a high breakdown voltage and a high capacitance have been developed and put to practical use. Also, materials contained in the switching elements have shifted to wide-gap materials to increase the breakdown voltages of the elements. The representative elements designed to increase the breakdown voltages include Schottky barrier diodes (i.e., SBDs) and p-n diodes (PNDs). These diodes are widely used in various applications.

As exemplified in Patent Document 1, a trench MOS-type SBD has been developed as an element including a semiconductor layer containing gallium oxide. When a reverse voltage is applied to an SBD containing a semiconductor material with high breakdown strength, a leakage current between an anode electrode and a semiconductor material layer typically increases. In contrast, in the trench MOS-type SBD of Patent Document 1, the electric field applied to an edge portion of the anode electrode can be dispersed and reduced. This can increase the reverse breakdown voltage of the element.

Moreover, according to the technology exemplified in Patent Document 2, concentration of the electric field is reduced by a depletion layer formed by a p-n junction portion that is an interface between a termination structure and a drift layer. This can reduce a forward voltage and a reverse leakage current of a semiconductor device, and simplify rectification operations.

PRIOR ART DOCUMENT

Patent Document

[Patent Document 1] Japanese Patent Application Laid-Open No. 2017-199869

[Patent Document 2] Japanese Unexamined Patent Application Publication (Translation of PCT Application) No. 2013-522876

SUMMARY

Problem to be Solved by the Invention

The semiconductor device containing $Ga_2O_3$ which is exemplified in Patent Document 1 has a trench structure and a MOS structure. Although such structures can expectedly increase the reverse breakdown voltage owing to the electric field reducing effect, the MOS structure causes a problem in that one cannot expect a breakdown voltage higher than or equal to that of the p-n structure.

Moreover, in the semiconductor device containing SiC which is exemplified in Patent Document 2, an oxide is not assumed as a material contained in a semiconductor layer. Here, in an oxide semiconductor device where oxide semiconductors of different types form a hetero p-n junction, chemical change (an oxidation-reduction reaction) at an interface of the p-n junction deactivates the conductivity of the p-type semiconductor and sometimes deteriorates the characteristics of the oxide semiconductor device. Particularly, post-annealing or the influence of heat caused by the current brings this phenomenon to the fore.

The present invention has been conceived in view of the problems, and has an object of providing a technology for enabling prevention of the deterioration of the characteristics of the oxide semiconductor device.

Means to Solve the Problem

An oxide semiconductor device according to the present invention includes: an n-type gallium oxide layer; a p-type oxide semiconductor layer disposed above the n-type gallium oxide layer, the p-type oxide semiconductor layer containing, as a main component, an element different from gallium and having p-type conductivity; a first electrode electrically bonded to the p-type oxide semiconductor layer; and an oxide layer disposed between the n-type gallium oxide layer and the p-type oxide semiconductor layer, the oxide layer being made of a material different from gallium oxide and different at least partly from a material of the p-type oxide semiconductor layer.

Effects of the Invention

According to the present invention, the oxide layer, which is made of a material different from gallium oxide and different at least partly from a material of the p-type oxide semiconductor layer, is disposed between the n-type gallium oxide layer and the p-type oxide semiconductor layer. Such a structure can prevent the deterioration of the characteristics of the oxide semiconductor device.

The objects, features, aspects and advantages of the present invention will become more apparent from the following detailed description and the accompanying drawings.

DESCRIPTION OF EMBODIMENTS

Figure 1:
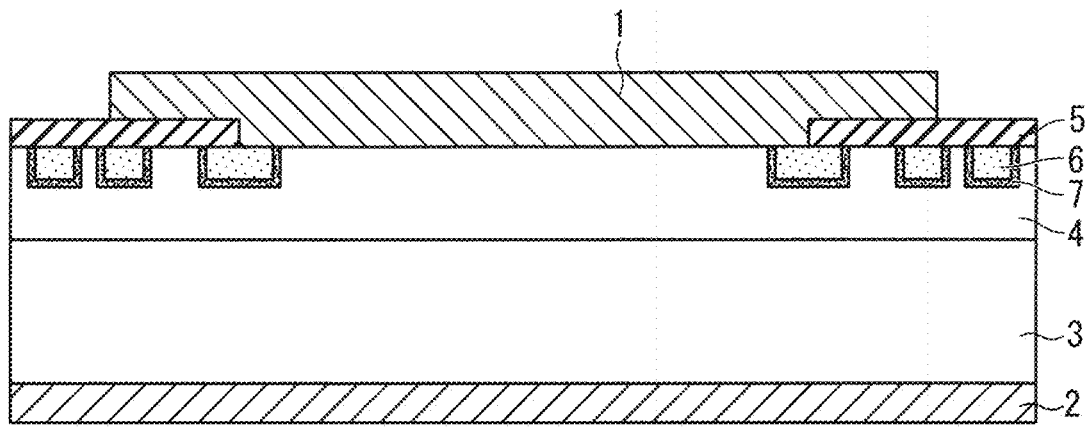
FIG. 1 is a cross-sectional view schematically exemplifying a structure of an oxide semiconductor device according to Embodiment 1.

Hereinafter, Embodiments of the present invention will be described with reference to the accompanying drawings. The drawings are drawn in schematic form, and the structures are appropriately omitted or simplified for convenience in description. The mutual relationships in size and position between the structures in the different drawings are not necessarily accurate but may be changed when needed.

In the following description, the same reference numerals are assigned to the same constituent elements, and their names and functions are the same. Therefore, detailed description of such constituent elements may be omitted to avoid redundant description.

Embodiment 1

An oxide semiconductor device and a method for manufacturing the oxide semiconductor device according to Embodiment 1 will be described hereinafter. First, a structure of the oxide semiconductor device according to Embodiment 1 will be described. In the following description, the oxide semiconductor device may be simply referred to as a "semiconductor device".

FIG. 1 is a cross-sectional view schematically exemplifying a structure for materializing the semiconductor device according to Embodiment 1. In the semiconductor device according to Embodiment 1, a termination structure of a Schottky barrier diode (SBD) includes p-type oxide semiconductor layers 6.

The semiconductor device according to Embodiment 1 including an electrode on the upper side of a substrate as an anode electrode 1 and an electrode on the lower side of the substrate as a cathode electrode 2 will be described. However, the semiconductor device according to Embodiment 1 is not limited to the SBD but may be another power device element such as a switching element.

The semiconductor device exemplified in FIG. 1 includes an n-type gallium oxide layer. Although an example of the n-type gallium oxide layer including an n-type single-crystal gallium oxide substrate 3 and an n-type gallium oxide epitaxial layer 4 will be described, the n-type gallium oxide layer is not limited to this example.

The n-type single-crystal gallium oxide substrate 3 is an n-type oxide semiconductor including an upper surface (a first principal surface) and a lower surface opposite to the upper surface (a second principal surface). The n-type gallium oxide epitaxial layer 4 is an epitaxial layer disposed on the upper surface of the n-type single-crystal gallium oxide substrate 3.

The semiconductor device exemplified in FIG. 1 includes, on the upper surface of the n-type gallium oxide epitaxial layer 4, the anode electrode 1 that is the first electrode and forms an electrical Schottky junction with the n-type gallium oxide epitaxial layer 4. Furthermore, the semiconductor device exemplified in FIG. 1 includes, on the lower surface of the n-type single-crystal gallium oxide substrate 3, the cathode electrode 2 that is the second electrode and forms an electrical Ohmic junction with the lower surface of the n-type single-crystal gallium oxide substrate 3.

The semiconductor device exemplified in FIG. 1 includes the p-type oxide semiconductor layers 6 containing, as a main component, an element different from gallium and having p-type conductivity. Although the plurality of p-type oxide semiconductor layers 6 with spacings are embedded from the upper surface to the inside of the n-type gallium oxide epitaxial layer 4 according to Embodiment 1, they have only to be disposed above the n-type gallium oxide epitaxial layer 4. The anode electrode 1 forms an electrical Ohmic junction with the p-type oxide semiconductor layers 6.

The semiconductor device exemplified in FIG. 1 includes oxide layers 7 which are disposed between the n-type gallium oxide epitaxial layer 4 and the p-type oxide semiconductor layers 6 to separate these. The oxide layers 7 are made of a material different from gallium oxide and different at least partly from that of the p-type oxide semiconductor layers 6. The oxide layers 7 being made of a material different at least partly from that of the p-type oxide semiconductor layers 6 involve, for example: (i) compounds of the oxide layers 7 being different from those of the p-type oxide semiconductor layers 6; (ii) a part of the plurality of compounds of the oxide layers 7 being identical to those of the p-type oxide semiconductor layers 6 but the remaining part of the compounds being different from those of the p-type oxide semiconductor layers 6; and (iii) a part of the plurality of compounds of the p-type oxide semiconductor layers 6 being identical to those of the oxide layers 7 but the remaining part of the compounds being different from those of the oxide layers 7.

Such oxide layers 7 can inhibit chemical reactions in a p-n interface between the n-type gallium oxide epitaxial layer 4 and the p-type oxide semiconductor layers 6 and maintain the normal interface. As a result, the deterioration of the characteristics of the oxide semiconductor device such as heat resistance and voltage resistance can be prevented.

The semiconductor device exemplified in FIG. 1 includes, in the termination structure, a field-plate insulating material layer 5 disposed between the n-type gallium oxide epitaxial layer 4 and the anode electrode 1. A laminated portion of the field-plate insulating material layer 5 and the anode electrode 1 forms a field plate structure. This increases the breakdown voltage of the semiconductor device when a reverse voltage is applied to the semiconductor device.

Next, the aforementioned constituent elements will be further described in detail.

The n-type single-crystal gallium oxide substrate 3 is an n-type oxide semiconductor made of single crystal $Ga_2O_3$, and is more preferably an n-type oxide semiconductor made of single crystal $\beta$-$Ga_2O_3$. Since the n-type single-crystal gallium oxide substrate 3 exhibits n-type conductivity due to oxygen deficiency in crystals, it does not have to contain n-type impurities. However, the n-type single-crystal gallium oxide substrate 3 may contain n-type impurities such as silicon (Si) or tin (Sn). In other words, the n-type single-crystal gallium oxide substrate 3 may be any of the following substrates: a substrate that exhibits n-type conductivity due to only oxygen deficiency; a substrate that exhibits n-type conductivity due to only n-type impurities; and a substrate that exhibits n-type conductivity due to both oxygen deficiency and n-type impurities.

The electron carrier concentration of the n-type single-crystal gallium oxide substrate 3 containing n-type impurities is a total density calculated from oxygen deficiency and the n-type impurities. The electron carrier concentration of the n-type single-crystal gallium oxide substrate 3 may be, for example, higher than or equal to $1\times10^{17}$ cm$^{-3}$ and lower than or equal to $1\times10^{19}$ cm$^{-3}$. The impurity concentration may be set higher than the numerical range to reduce contact resistance between the n-type single-crystal gallium oxide substrate 3 and the cathode electrode 2.

The n-type gallium oxide epitaxial layer 4 is disposed on the upper surface of the n-type single-crystal gallium oxide substrate 3. The n-type gallium oxide epitaxial layer 4 is an n-type oxide semiconductor made of single crystal $Ga_2O_3$, and is more preferably an n-type oxide semiconductor made of single crystal $\beta$-$Ga_2O_3$. An n-type carrier density of the n-type gallium oxide epitaxial layer 4 is preferably lower than that of the n-type single-crystal gallium oxide substrate 3, and may be, for example, higher than or equal to $1\times10^{15}$ cm$^{-3}$ and lower than or equal to $1\times10^{17}$ cm$^{-3}$.

The cathode electrode 2 is disposed on the lower surface of the n-type single-crystal gallium oxide substrate 3. Since the cathode electrode 2 forms an Ohmic junction with the n-type single-crystal gallium oxide substrate 3, the cathode electrode 2 is preferably made of a metal whose work function is smaller than that of the n-type single-crystal gallium oxide substrate 3. Furthermore, the cathode electrode 2 is preferably made of a metal that reduces contact resistance between the n-type single-crystal gallium oxide substrate 3 and the cathode electrode 2 through heat treatment performed after forming the cathode electrode 2 on the lower surface of the n-type single-crystal gallium oxide substrate 3.

Such metal may be, for example, titanium (Ti). Furthermore, the cathode electrode 2 may be formed by laminating a plurality of metals. For example, when a metal easily oxidized comes in contact with the lower surface of the n-type single-crystal gallium oxide substrate 3, a metal hardly oxidized may be formed on the lower surface of the metal easily oxidized to obtain the cathode electrode 2 with a laminated structure. For example, the cathode electrode 2 may be formed by forming a first layer made of Ti which comes in contact with the n-type single-crystal gallium oxide substrate 3 and then forming a second layer made of gold (Au) or silver (Ag) on the lower surface of the first layer. Furthermore, the cathode electrode 2 may be disposed on the entire lower surface or a part of the lower surface of the n-type single-crystal gallium oxide substrate 3.

The anode electrode 1 is disposed on the upper surface of the n-type gallium oxide epitaxial layer 4. Since the anode electrode 1 forms a Schottky junction with the n-type gallium oxide epitaxial layer 4, the anode electrode 1 is preferably made of a metal whose work function is larger than that of the n-type gallium oxide epitaxial layer 4. Since the anode electrode 1 also forms an Ohmic junction with the p-type oxide semiconductor layers 6, the anode electrode 1 is more preferably made of a metal whose work function is smaller than that of the p-type oxide semiconductor layers 6 (a p-type oxide semiconductor material).

Examples of the metal may include platinum (Pt), nickel (Ni), gold (Au), and palladium (Pd). The anode electrode 1 may have a laminated structure similarly to the cathode electrode 2. For example, the anode electrode 1 may be formed by forming a first layer made of a metal suited for the Schottky junction with the n-type gallium oxide epitaxial layer 4, in contact with the n-type gallium oxide epitaxial layer 4 and then forming a second layer made of another metal on the upper surface of the first layer.

The p-type oxide semiconductor layers 6 are embedded from the upper surface to the inside of the n-type gallium oxide epitaxial layer 4. The p-type oxide semiconductor layers 6 are made of a p-type oxide semiconductor exhibiting p-type conductivity without being doped with p-type impurities, such as copper oxide ($Cu_2O$), silver oxide ($Ag_2O$), nickel oxide (NiO), or tin oxide (SnO). For example, $Cu_2O$, which is a metal oxide, exhibits p-type conductivity because the 3$d$ orbital of Cu forms the valence band maximum that undertakes hole conduction, and holes appear due to Cu deficiency. When $Cu_2O$ transforms into CuO due to oxidation, the 3$d$ orbital of Cu does not form the valence band maximum, and the p-type conductivity is lost. The p-type oxide semiconductor layers 6 are made of a p-type oxide semiconductor that is a metal oxide with such properties. The described p-type oxide semiconductor such as $Cu_2O$ typically exhibits p-type conductivity without being doped with p-type impurities.

Although being made of a p-type oxide semiconductor exhibiting p-type conductivity without being doped with p-type impurities, the p-type oxide semiconductor layers 6 may be doped with p-type impurities. For example, when the p-type oxide semiconductor layers 6 are made of $Cu_2O$, nitrogen (N) may be used as the p-type impurities. When the p-type oxide semiconductor layers 6 are not doped with p-type impurities, the p-type carrier density is a density of metal atom deficiency in the p-type oxide semiconductor. When the p-type oxide semiconductor layers 6 are doped with p-type impurities, the p-type carrier density is a total density calculated from the metal atom deficiency and the p-type impurities in the p-type oxide semiconductor.

When the p-type oxide semiconductor layers 6 are doped with p-type impurities, even after the metal oxide of the p-type oxide semiconductor is oxidized and loses p-type conductivity, the entire p-type oxide semiconductor sometimes exhibits the p-type conductivity with the p-type impurities. When the metal oxide of the p-type oxide semiconductor is oxidized and loses the p-type conductivity corresponding to the oxidation, the p-type conductivity of the entire p-type oxide semiconductor decreases. Thus, it is preferred not to oxidize the metal oxide of the p-type oxide semiconductor.

The field-plate insulating material layer 5 is made of a material, for example, silicon dioxide ($SiO_2$) or aluminum oxide ($Al_2O_3$). Such a material has higher breakdown field strength than that of $Ga_2O_3$ contained in the n-type gallium oxide epitaxial layer 4. The field-plate insulating material layer 5 may be approximately several hundred nanometers thick, for example, thicker than or equal to 100 nm and thinner than or equal to 200 nm.

The oxide layers 7 are made of, for example, a mixed crystal of $Cu_2O$ and $Al_2O_3$. The oxide layers 7 are disposed at the entire interface between the n-type gallium oxide epitaxial layer 4 and the p-type oxide semiconductor layers 6 to separate these. Particularly, when the metal oxide contained in the p-type oxide semiconductor layers 6 is included in the mixed crystal of the oxide layers 7, each of the oxide layers 7 is preferably thicker than or equal to 3 nm, for example, thicker than or equal to 3 nm and thinner than or equal to 200 nm.

For example, when the oxide layers 7 are made of the mixed crystal of $Cu_2O$ and $Al_2O_3$ and the p-type oxide semiconductor layers 6 are made of $Ag_2O$, the compounds of the oxide layers 7 are different from those of the p-type oxide semiconductor layers 6. For example, when the oxide layers 7 are made of the mixed crystal of $Cu_2O$ and $Al_2O_3$ and the p-type oxide semiconductor layers 6 are made of $Cu_2O$, a part ($Cu_2O$) of the compounds of the oxide layers 7 is identical to that ($Cu_2O$) of the p-type oxide semiconductor layers 6 and the remaining part ($Al_2O_3$) of the compounds is different from that ($Cu_2O$) of the p-type oxide semiconductor layers 6.

[Method for Manufacturing Oxide Semiconductor Device]

Next, a method for manufacturing the semiconductor device according to Embodiment 1 will be described.

Figure 2:
FIG. 2 is a cross-sectional view for describing a manufacturing process of the oxide semiconductor device according to Embodiment 1.

First, the n-type single-crystal gallium oxide substrate 3 is prepared as illustrated in FIG. 2. The n-type single-crystal gallium oxide substrate 3 can be a substrate obtained by cutting, into substrates, a single-crystal bulk β-$Ga_2O_3$ produced by a melt growth process.

Figure 3:
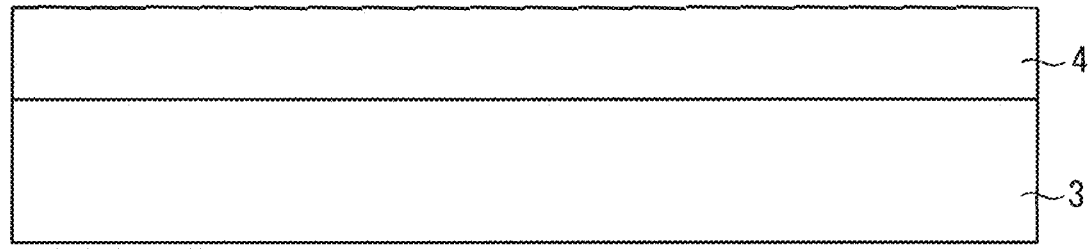
FIG. 3 is a cross-sectional view for describing a manufacturing process of the oxide semiconductor device according to Embodiment 1.

Then, the n-type gallium oxide epitaxial layer 4 is deposited on the upper surface of the n-type single-crystal gallium oxide substrate 3 through epitaxial growth as illustrated in FIG. 3. The n-type gallium oxide epitaxial layer 4 can be formed on the upper surface of the n-type single-crystal gallium oxide substrate 3 by a method such as metal organic chemical vapor deposition (i.e., MOCVD), molecular beam epitaxy (i.e., MBE), or halide vapor phase epitaxy (i.e., HVPE).

Figure 4:
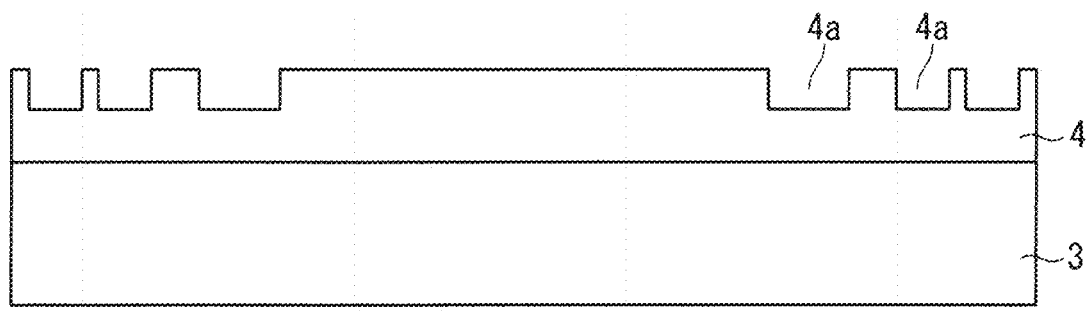
FIG. 4 is a cross-sectional view for describing a manufacturing process of the oxide semiconductor device according to Embodiment 1.

Next, trenches 4a that are ditches are formed on the upper surface of the n-type gallium oxide epitaxial layer 4, using dry etching gas such as boron trichloride ($BCl_3$) as illustrated in FIG. 4. The method for forming the trenches 4a is not particularly limited, but can be an existing formation method such as dry etching or wet etching.

Figure 5:
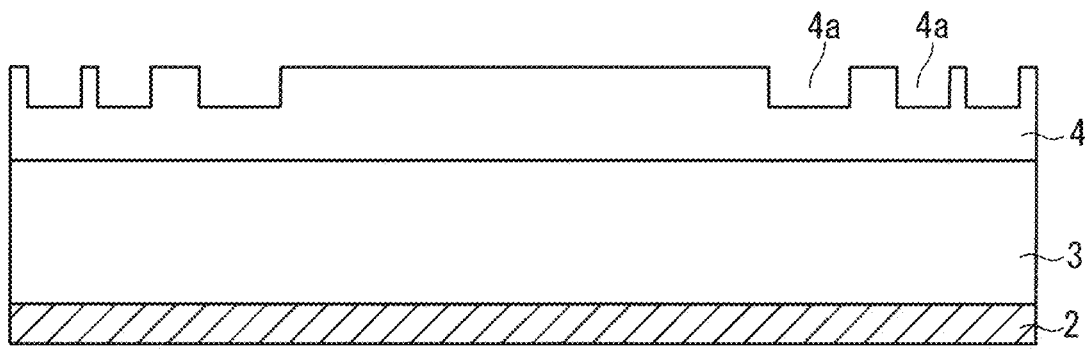
FIG. 5 is a cross-sectional view for describing a manufacturing process of the oxide semiconductor device according to Embodiment 1.

Next, a metal for the cathode electrode 2 is deposited by vapor deposition or sputtering on the lower surface of the n-type single-crystal gallium oxide substrate 3 as illustrated in FIG. 5. For example, a Ti layer of a thickness of 100 nm is deposited on the lower surface of the n-type single-crystal gallium oxide substrate 3 by electron beam evaporation (EB evaporation). Then, an Ag layer of a thickness of 300 nm is deposited on the Ti layer by electron beam evaporation to form the cathode electrode 2 having a two-layer structure. Thereafter, for example, heat treatment is performed at 550° C. for five minutes under a nitrogen or oxygen atmosphere. As a result, the cathode electrode 2 that forms an Ohmic junction with the n-type single-crystal gallium oxide substrate 3 is formed on the lower surface of the n-type single-crystal gallium oxide substrate 3. To reduce contact resistance between the n-type single-crystal gallium oxide substrate 3 and the cathode electrode 2, an RIE process using gas such as $BCl_3$ is performed on the lower surface of the n-type single-crystal gallium oxide substrate 3 before forming the cathode electrode 2.

Next, the oxide layers 7 are formed to cover the trenches 4a. There are the following two methods for forming the oxide layers 7.

Figure 6:
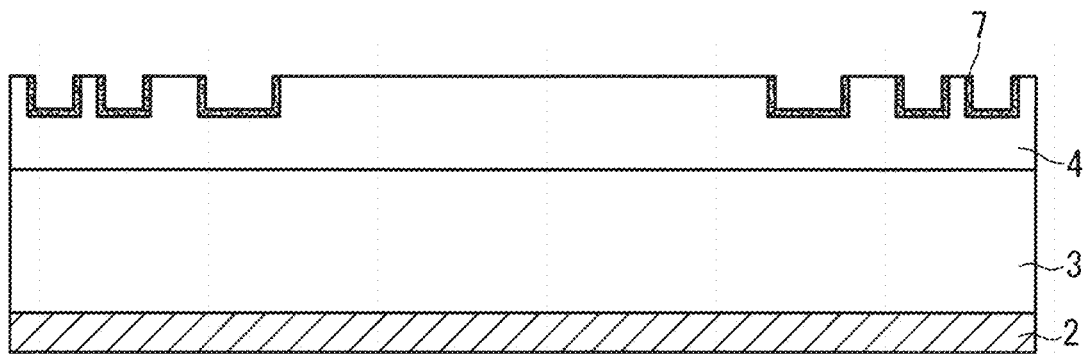
FIG. 6 is a cross-sectional view for describing a manufacturing process of the oxide semiconductor device according to Embodiment 1.
Figure 7:
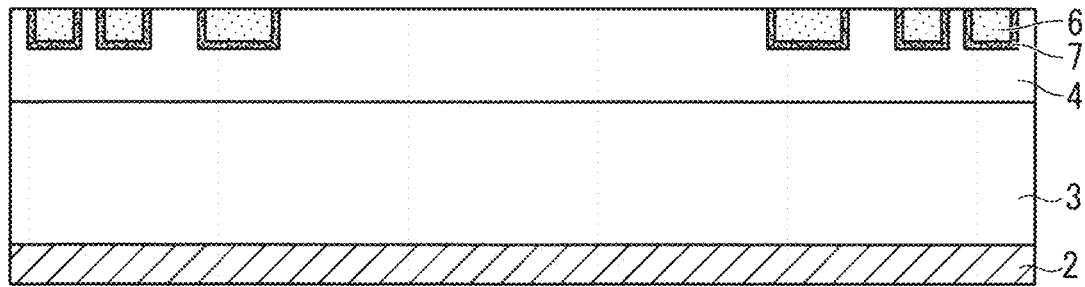
FIG. 7 is a cross-sectional view for describing a manufacturing process of the oxide semiconductor device according to Embodiment 1.

The first method is a method for directly forming the oxide layers 7 with desired physical properties on the trenches 4a, using a method such as co-sputtering or Pulse Laser Deposition (i.e., PLD) as illustrated in FIG. 6. In this method, the p-type oxide semiconductor layers 6 are subsequently formed on the oxide layers 7 to fill the trenches 4a with the p-type oxide semiconductor layers 6 as illustrated in FIG. 7.

The second method is a method for forming the oxide layers 7 through heat treatment performed after forming the p-type oxide semiconductor layers 6, which is not illustrated. For example, when the p-type oxide semiconductor layers 6 are made of $Cu_2O$, $Al_2O_3$ can be selected as a material for the oxide layers 7. Here, forming an $Al_2O_3$ film on the trenches 4a, forming the p-type oxide semiconductor layers 6 made of $Cu_2O$ on the $Al_2O_3$ film, and then performing heat treatment thereon forms a mixed crystal oxide of the $Al_2O_3$ film and $Cu_2O$. As a result, the oxide layers 7 made of a mixed crystal of $Cu_2O$ on the $Al_2O_3$ can be formed. Here, the $Al_2O_3$ film is preferably thicker than or equal to 3 nm. Furthermore, the heat treatment, that is, formation of the oxide layers 7 is preferably performed at a temperature higher than or equal to 400° C., and more preferably at a temperature higher than or equal to 400° C. and lower than or equal to 1200° C.

Figure 8:
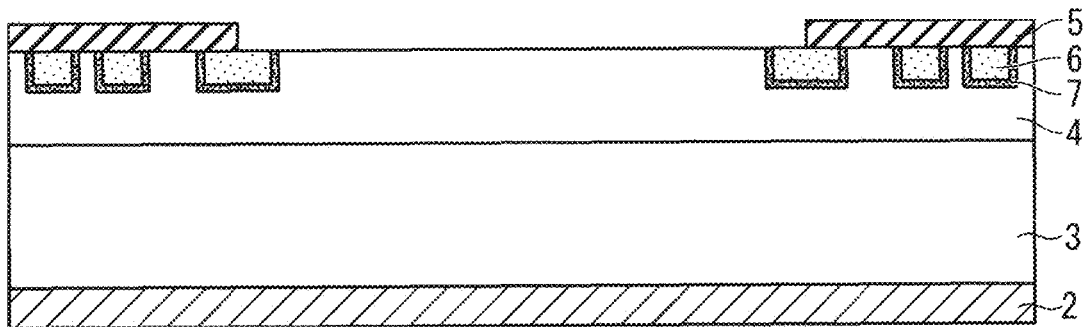
FIG. 8 is a cross-sectional view for describing a manufacturing process of the oxide semiconductor device according to Embodiment 1.

Next, the field-plate insulating material layer 5 is formed on the n-type gallium oxide epitaxial layer 4 and the p-type oxide semiconductor layers 6 in the termination structure as illustrated in FIG. 8. The method for forming the field-plate insulating material layer 5 is not particularly limited, but can be, for example, Spin-on Glass (i.e., SOG).

Figure 9:
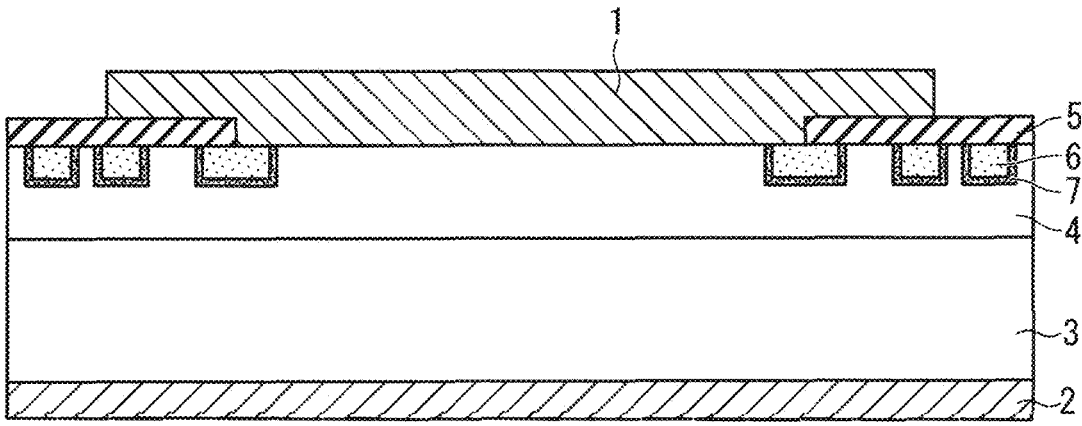
FIG. 9 is a cross-sectional view for describing a manufacturing process of the oxide semiconductor device according to Embodiment 1.

Lastly, the anode electrode 1 is formed on the n-type gallium oxide epitaxial layer 4 and the p-type oxide semiconductor layers 6 to be exposed from the field-plate insulating material layer 5 as illustrated in FIG. 9 to complete the semiconductor device according to Embodiment 1.

Conclusion of Embodiment 1

In the oxide semiconductor device according to Embodiment 1, the oxide layers 7, which are made of a material different from gallium oxide and different at least partly from that of the p-type oxide semiconductor layers 6, are disposed between the n-type gallium oxide epitaxial layer 4 and the p-type oxide semiconductor layers 6. Since this structure can inhibit chemical reactions at the p-n interface between the n-type gallium oxide epitaxial layer 4 and the p-type oxide semiconductor layers 6, the deterioration of the characteristics of the oxide semiconductor device such as heat resistance and voltage resistance can be prevented.

Embodiment 2

Figure 10:
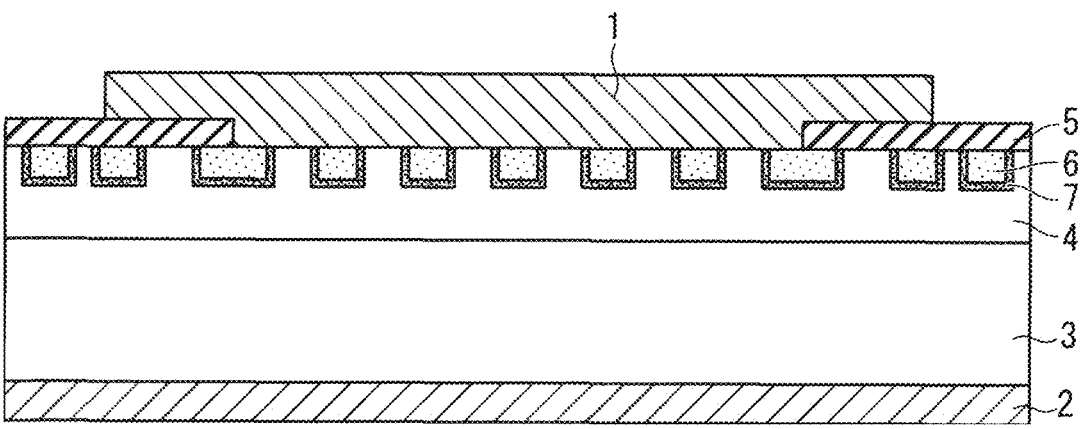
FIG. 10 is a cross-sectional view schematically exemplifying a structure of an oxide semiconductor device according to Embodiment 2.

FIG. 10 is a cross-sectional view schematically exemplifying a structure of a semiconductor device according to Embodiment 2 of the present invention. The method for manufacturing the semiconductor device according to Embodiment 2 is identical to that according to Embodiment 1.

In the semiconductor device according to Embodiment 1 (FIG. 1), the plurality of p-type oxide semiconductor layers 6 are disposed in the termination structure as guard rings. In the semiconductor device according to Embodiment 2 (FIG. 10), the plurality of p-type oxide semiconductor layers 6 are disposed not only in the termination structure but also in the element portions. Specifically, the plurality of p-type oxide semiconductor layers 6 with spacings are embedded in the upper surface of the n-type gallium oxide epitaxial layer 4 that is exposed from the field-plate insulating material layer 5. Thus, a Merged PiN/Schottky (MPS) structure that is a combination of a p-n junction and a Schottky junction is disposed according to Embodiment 2.

In the MPS structure, a bipolar operation of a PND enables a larger surge current exceeding the rating to flow with a small voltage drop than by a single SBD. Thus, the oxide semiconductor device with the MPS structure according to Embodiment 2 improves the forward surge tolerance. This can suppress increase in the forward voltage drop, and materialize a semiconductor device with a rectification function and the high forward surge tolerance.

Embodiment 3

Figure 11:
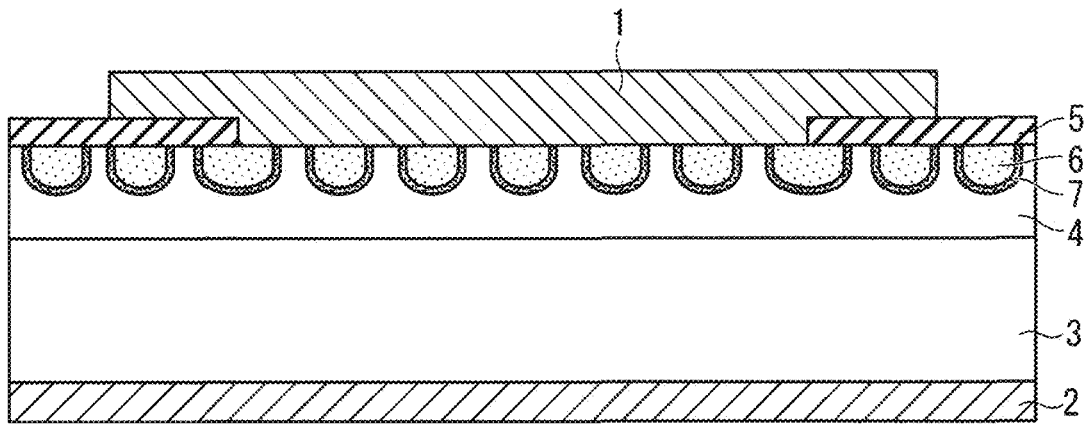
FIG. 11 is a cross-sectional view schematically exemplifying a structure of an oxide semiconductor device according to Embodiment 3.

FIG. 11 is a cross-sectional view schematically exemplifying a structure of a semiconductor device according to Embodiment 3 of the present invention. The method for manufacturing the semiconductor device according to Embodiment 3 is identical to that according to Embodiment 1.

In the semiconductor device exemplified in FIG. 11, the bottom of each of the trenches 4a, or the bottom of each of the p-type oxide semiconductor layers 6 and the oxide layers 7 is different from that in the semiconductor device (FIG. 10) exemplified in Embodiment 2. Specifically, the bottom of each of the p-type oxide semiconductor layers 6 and the oxide layers 7 is bent and is almost arc-shaped as exemplified in FIG. 11 according to Embodiment 3. Since concentration of the electric field can be reduced when a reverse voltage is applied to the oxide semiconductor device according to Embodiment 3, increase in the reverse breakdown voltage can be expected.

Embodiment 4

Figure 12:
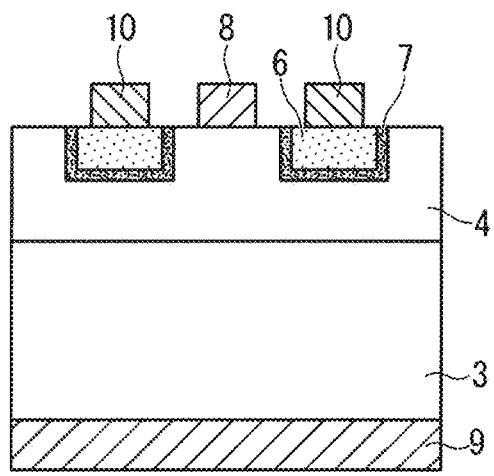
FIG. 12 is a cross-sectional view schematically exemplifying a structure of an oxide semiconductor device according to Embodiment 4.

FIG. 12 is a cross-sectional view schematically exemplifying a structure of a semiconductor device according to Embodiment 4 of the present invention. Among the constituent elements according to Embodiment 4, the same reference numerals are assigned to the same constituent elements already described, and the different constituent elements will be mainly described in the following description.

The semiconductor device exemplified in FIG. 12 is a field effect transistor whose current direction is the vertical direction in FIG. 12. The semiconductor device exemplified in FIG. 12 includes a source electrode 8 and gate electrodes 10 that are disposed above a substrate, and a drain electrode 9 that is disposed on the bottom of the substrate. The source electrode 8 is directly bonded to a portion adjacent to the p-type oxide semiconductor layers 6 in the n-type gallium oxide epitaxial layer 4. The drain electrode 9 is directly bonded to the lower surface of the n-type single-crystal gallium oxide substrate 3. The gate electrodes 10 that are the first electrodes are directly bonded to the p-type oxide semiconductor layers 6 without being bonded to the n-type gallium oxide epitaxial layer 4.

In the semiconductor device according to Embodiment 4, the oxide layers 7 are inserted into the interface between the n-type gallium oxide epitaxial layer 4 and the p-type oxide semiconductor layers 6, similarly to the structures described in Embodiments above. Thus, the chemical reactions at the p-n interface between the n-type gallium oxide epitaxial layer 4 and the p-type oxide semiconductor layers 6 can be inhibited, and the normal interface can be maintained also in the semiconductor device according to Embodiment 4. As a result, the deterioration of the characteristics of the oxide semiconductor device such as heat resistance and voltage resistance can be prevented.

Embodiment 5

Figure 13:
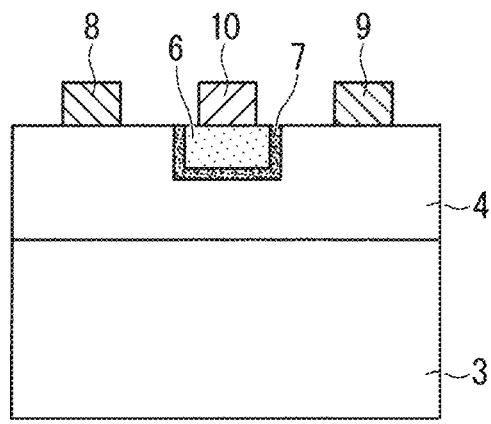
FIG. 13 is a cross-sectional view schematically exemplifying a structure of an oxide semiconductor device according to Embodiment 5.

FIG. 13 is a cross-sectional view schematically exemplifying a structure of a semiconductor device according to Embodiment 5 of the present invention. Among the constituent elements according to Embodiment 5, the same reference numerals are assigned to the same constituent elements already described, and the different constituent elements will be mainly described in the following description.

The semiconductor device exemplified in FIG. 13 is a field effect transistor whose current direction is the horizontal direction in FIG. 13. The semiconductor device exemplified in FIG. 13 includes the source electrode 8, the drain electrode 9, and the gate electrode 10 that are disposed above the substrate. The source electrode 8 is directly bonded to a first portion adjacent to the p-type oxide semiconductor layer 6 in the n-type gallium oxide epitaxial layer 4. The drain electrode 9 is directly bonded to a second portion adjacent to the p-type oxide semiconductor layer 6 in the n-type gallium oxide epitaxial layer 4 on the opposite side of the first portion. The gate electrode 10 that is the first electrode is directly bonded to the p-type oxide semiconductor layer 6 without being bonded to the n-type gallium oxide epitaxial layer 4, and is disposed between the source electrode 8 and the drain electrode 9.

In the semiconductor device according to Embodiment 5, the oxide layer 7 is inserted into the interface between the n-type gallium oxide epitaxial layer 4 and the p-type oxide semiconductor layer 6, similarly to the structures described in Embodiments above. Thus, the chemical reactions at the p-n interface between the n-type gallium oxide epitaxial layer 4 and the p-type oxide semiconductor layer 6 can be inhibited, and the normal interface can be maintained also in the semiconductor device according to Embodiment 5. As a result, the deterioration of the characteristics of the oxide semiconductor device such as heat resistance and voltage resistance can be prevented.

Embodiments and the modifications can be freely combined, and appropriately modified or omitted within the scope of the invention.

Although this invention is described in detail, the description is in all aspects illustrative and does not restrict the invention. Therefore, numerous modifications and variations that have not yet been exemplified are devised without departing from the scope of the present invention.

EXPLANATION OF REFERENCE SIGNS

1 anode electrode, 2 cathode electrode, 3 n-type single-crystal gallium oxide substrate, 4 n-type gallium oxide epitaxial layer, 5 field-plate insulating material layer, 6 p-type oxide semiconductor layer, 7 oxide layer, 8 source electrode, 9 drain electrode, 10 gate electrode.

The invention claimed is:

1. An oxide semiconductor device, comprising:
   an n-type gallium oxide layer;
   a p-type oxide semiconductor layer disposed above the n-type gallium oxide layer, the p-type oxide semiconductor layer containing, as a main component, an element different from gallium and having p-type conductivity;
   a first electrode electrically bonded to the p-type oxide semiconductor layer; and
   an oxide layer disposed between the n-type gallium oxide layer and the p-type oxide semiconductor layer, the oxide layer being made of a material different from gallium oxide and different at least partly from a material of the p-type oxide semiconductor layer.

2. The oxide semiconductor device according to claim 1, further comprising
   a second electrode electrically bonded to a lower surface of the n-type gallium oxide layer,
   wherein the first electrode is also electrically connected to an upper surface of the n-type gallium oxide layer.

3. The oxide semiconductor device according to claim 1, wherein a plurality of the p-type oxide semiconductor layers with spacings are embedded in an upper surface of the n-type gallium oxide layer.

4. The oxide semiconductor device according to claim 1, wherein the p-type oxide semiconductor layer is made of a metal oxide containing Cu.

5. The oxide semiconductor device according to claim 1, wherein the oxide layer is made of an oxide containing $Al_2O_3$ as a main component.

6. The oxide semiconductor device according to claim 1, wherein the oxide layer is made of a metal oxide containing Cu and Al.

7. The oxide semiconductor device according to claim 1, wherein the oxide layer is thicker than or equal to 3 nm.

8. A method for manufacturing the oxide semiconductor device according to claim 1, the method comprising
   forming the oxide layer at a temperature higher than or equal to 400° C.

9. The oxide semiconductor device according to claim 1, further comprising:
   a source electrode bonded to a portion adjacent to the p-type oxide semiconductor layer in the n-type gallium oxide layer; and
   a drain electrode bonded to a lower surface of the n-type gallium oxide layer,
   wherein the first electrode is a gate electrode.

10. The oxide semiconductor device according to claim 1, further comprising:
    a source electrode bonded to a first portion adjacent to the p-type oxide semiconductor layer in the n-type gallium oxide layer; and
    a drain electrode bonded to a second portion adjacent to the p-type oxide semiconductor layer in the n-type gallium oxide epitaxial layer on an opposite side of the first portion,
    wherein the first electrode is a gate electrode disposed between the source electrode and the drain electrode.

* * * * *